United States Patent
Naganawa et al.

(10) Patent No.: US 9,234,272 B2
(45) Date of Patent: Jan. 12, 2016

(54) GAS BARRIER FILM AND METHOD FOR PRODUCING GAS BARRIER FILM

(71) Applicant: LINTEC CORPORATION, Tokyo (JP)

(72) Inventors: Satoshi Naganawa, Tokyo (JP); Yuta Suzuki, Tokyo (JP)

(73) Assignee: LINTEC CORPORATION, Tokyo (JP)

( * ) Notice: Subject to any disclaimer, the term of this patent is extended or adjusted under 35 U.S.C. 154(b) by 0 days.

(21) Appl. No.: 14/354,252

(22) PCT Filed: Oct. 12, 2012

(86) PCT No.: PCT/JP2012/076383
§ 371 (c)(1),
(2) Date: Apr. 25, 2014

(87) PCT Pub. No.: WO2013/069402
PCT Pub. Date: May 16, 2013

(65) Prior Publication Data
US 2014/0342149 A1 Nov. 20, 2014

(30) Foreign Application Priority Data
Nov. 7, 2011 (JP) .................................. 2011-243407

(51) Int. Cl.
*C23C 14/48* (2006.01)
*C01B 21/082* (2006.01)
*C08J 7/12* (2006.01)
(Continued)

(52) U.S. Cl.
CPC ............. *C23C 14/48* (2013.01); *C01B 21/0823* (2013.01); *C08J 7/047* (2013.01); *C08J 7/123* (2013.01); *C23C 14/0676* (2013.01);
(Continued)

(58) Field of Classification Search
None
See application file for complete search history.

(56) References Cited

U.S. PATENT DOCUMENTS

2008/0096014 A1* 4/2008 Griesser et al. ............... 428/336
2009/0297813 A1* 12/2009 Erlat et al. .................... 428/220
(Continued)

FOREIGN PATENT DOCUMENTS

EP 2410005 A1 1/2012
EP 2455220 A1 5/2012
(Continued)

OTHER PUBLICATIONS

Plasma-Enhanced Growth, Composition, and Refractive Index of SiON Films, Mattsson, J Appl Phys. 77 (12) pp. 6616-6623 (1995).*
(Continued)

*Primary Examiner* — Kenneth Stachel
(74) *Attorney, Agent, or Firm* — Fitch, Even, Tabin & Flannery LLP

(57) ABSTRACT

Disclosed are a gas barrier film obtained by forming a gas barrier layer on a base material, and a method for producing such a gas barrier film, in which the gas barrier layer contains at least oxygen atoms, silicon atoms and nitrogen atoms, and in connection with the amount of nitrogen, the amount of silicon and the amount of oxygen measured by an XPS analysis, the gas barrier layer includes a first region constituted in the order of the amount of oxygen>the amount of silicon>the amount of nitrogen; a second region constituted in the order of the amount of silicon>the amount of oxygen>the amount of nitrogen; and a third region constituted in the order of the amount of oxygen>the amount of silicon>the amount of nitrogen, from a surface side toward a base material side.

11 Claims, 6 Drawing Sheets

(51) Int. Cl.
*C08J 7/04* (2006.01)
*C23C 14/06* (2006.01)

(52) U.S. Cl.
CPC .......... *C08J2367/02* (2013.01); *C08J 2483/16* (2013.01); *Y10T 428/265* (2015.01)

(56) References Cited

U.S. PATENT DOCUMENTS

| | | | |
|---|---|---|---|
| 2011/0274933 A1* | 11/2011 | Hoshi et al. | 428/446 |
| 2012/0064321 A1* | 3/2012 | Suzuki et al. | 428/219 |
| 2012/0107607 A1 | 5/2012 | Takaki et al. | |

FOREIGN PATENT DOCUMENTS

| | | | | |
|---|---|---|---|---|
| JP | 2003305799 A | * | 10/2003 | |
| JP | 2007-237588 A | | 9/2007 | |
| JP | 2009-196155 A | | 9/2009 | |
| JP | 2010-158832 A | | 7/2010 | |
| JP | 2011-26645 A | | 2/2011 | |
| WO | WO 2010067857 A1 | * | 6/2010 | ............. B32B 27/08 |
| WO | 2010/107018 A1 | | 9/2010 | |
| WO | 2011/007543 A1 | | 1/2011 | |

OTHER PUBLICATIONS

Structure and Optical Properties of Si Oxycarbide Films from Reactive RF Magnetron Sputtering, Miyazaki Japanese JI of Applied Physics vol. 47 No. 11, pp. 8287-8290 (2008).*
Characterization of Silicon Oxynitride Gas Barrier Films Iwamori Vacuum 68 113-117 (2003) Passivation 13_2_2 from Materials Selection and Applications in Mechanical Engineering by Raman (2007)).*
Characterization of Silicon Oxynitride Gas Barrier Films Iwamori Vacuum 68 113-117 (2003) English machine translation JP 2003-305799 (2003)).*
European Search Report dated May 7, 2015, in counterpart European Application No. 12847937.

* cited by examiner

GAS BARRIER FILM AND METHOD FOR PRODUCING GAS BARRIER FILM

TECHNICAL FIELD

The present invention relates to a gas barrier film and a method for producing a gas barrier film. Particularly, the invention relates to a gas barrier film having excellent gas barrier properties, and a method for producing such a gas barrier film.

BACKGROUND ART

For the purpose of obtaining substitutes for the glass substrates for organic EL elements, there has been hitherto suggested a method for producing a gas barrier film characterized by having excellent gas barrier properties and requiring a short production time, or the like (see, for example, Patent Document 1).

More specifically, it is a method for producing a gas barrier film characterized by subjecting a polysilazane film obtained by applying a perhydropolysilazane-containing liquid on at least one surface of a base material and heating and drying the liquid, to a normal pressure plasma treatment or a vacuum plasma treatment, and thereby producing a gas barrier film having a WVTR, which is an index of water vapor barrier properties, of 1 g/(m²·day) or less and a thickness of 0.01 μm to 5 μm.

Furthermore, there has been suggested a method for producing a gas barrier film which includes a silicon oxide thin film having very high gas barrier properties, so as to be applicable to resin base materials for organic photoelectric conversion elements (see, for example, Patent Document 2).

More specifically, it is a method for producing a gas barrier film characterized by applying a silicon-containing liquid on at least one surface of a base material, drying the liquid at 20° C. to 120° C. to form a silicon thin film, and then forming a silicon oxide thin film on the silicon thin film by a plasma CVD method which uses a reactive gas containing an organosilicon compound and oxygen.

Furthermore, there has been suggested a gas barrier film which includes a carbon-containing silicon oxide film having excellent transparency without having the gas barrier properties deteriorated (see, for example, Patent Document 3).

More specifically, it is a gas barrier film characterized in that a carbon-containing silicon oxide film having a film thickness of 5 nm to 300 nm is formed on at least one surface of a base material film, the composition ratio of carbon atoms (C) and silicon atoms (Si) (C/Si) of the carbon-containing silicon oxide film is in the range of more than 0 and 1.0 or less, and the degree of coloration (YI) is in the range of 1.0 to 5.0.

In addition, for the purpose of providing a gas barrier film having excellent transmittance and excellent tint, there have been suggested a gas barrier film which includes regions A, B and C with different amounts of silicon, different amounts of oxygen and different amounts of nitrogen, and a method for producing the gas barrier film (see, for example, Patent Document 4).

More specifically, it is a gas barrier film which includes a region A having an amount of oxygen larger than the amount of nitrogen; a region B having an amount of nitrogen larger than the amount of oxygen; and between these region A and region B, a region C in which the amount of oxygen of the region A gradually decreases, and the amount of nitrogen gradually increases toward the region B, the gas barrier film having, on a base material film, the various regions disposed according to the sequence of regions ACB, regions BCA, or regions ACBCA, toward the surface.

PRIOR ARTS DOCUMENTS

Patent Document

Patent Document 1: JP 2007-237588 A
Patent Document 2: JP 2011-26645 A
Patent Document 3: JP 2010-158832 A
Patent Document 4: JP 2009-196155 A

DISCLOSURE OF THE INVENTION

Problem to be Solved by the Invention

However, according to the method for producing a gas barrier film disclosed in Patent Document 1, although a polysilazane film is subjected to a normal pressure plasma treatment or a vacuum plasma treatment, the barrier layer after the plasma treatment is not taken into consideration at all. Therefore, the method revealed problems such as that the gas barrier properties were still low, and the gas barrier properties fluctuated.

Furthermore, according to the method for producing a gas barrier film disclosed in Patent Document 2, it was necessary to form, on a predetermined silicon thin film (a polysilazane film or the like), another kind of silicon oxide thin film by a plasma CVD method.

Therefore, the method revealed problems such as that thickness reduction or continuous film formation of the gas barrier film was difficult, or the adhesiveness between the silicon thin film as a foundation and the silicon oxide thin film formed according to a plasma CVD method was insufficient.

Furthermore, the gas barrier film and the method for producing the gas barrier film disclosed in Patent Document 3 revealed problems such as that the gas barrier properties were still low, the gas barrier properties fluctuated, and durability and the like were insufficient.

Furthermore, since the gas barrier film and the method for producing the gas barrier film disclosed in Patent Document 4 include a region B in which the amount of nitrogen is larger than the amount of oxygen, in a portion of a multilayer structure, the gas barrier film revealed problems such as that the gas barrier film thus obtainable was colored, or transparency thereof was likely to deteriorate.

Still further, since the respective regions A to C are formed by repeating plural film-forming steps, there were found problems such as complicated production processes, poor productivity, and still insufficient gas barrier properties.

Thus, the inventors of the present invention conducted a thorough investigation, and as a result, the inventors found that in regard to a gas barrier film produced by forming a gas barrier layer on a base material, when the gas barrier film is allowed to have, toward the gas barrier layer, plural regions each containing at least oxygen atoms, silicon atoms and nitrogen atoms and having respectively different compositions as analyzed by an XPS analysis, a gas barrier film which has extremely excellent gas barrier properties, is not likely to be colored and has excellent transparency, is obtained, thus completing the present invention.

That is, an object of the present invention is to provide a gas barrier film having excellent gas barrier properties, and a method for producing a gas barrier film capable of efficiently obtaining such a gas barrier film.

Means for Solving Problem

According to the present invention, there is provided a gas barrier film produced by forming a gas barrier layer on a base material, characterized in that the gas barrier layer contains at least oxygen atoms, silicon atoms and nitrogen atoms, and in connection with the amount of nitrogen, the amount of silicon and the amount of oxygen measured by an XPS analysis, when the surface of the gas barrier layer that is in contact with the base material is designated as a base material side, and the opposite surface is designated as a surface side, the gas barrier layer includes:

a first region constituted in the order of the amount of oxygen>the amount of silicon>the amount of nitrogen;

a second region constituted in the order of the amount of silicon>the amount of oxygen>the amount of nitrogen; and a third region constituted in the order of the amount of oxygen>the amount of silicon>the amount of nitrogen from the surface side toward the base material side. Thus, the problems of conventional gas barrier films can be solved.

That is, according to the present invention, a gas barrier film having excellent gas barrier properties, which includes a first region to a third region that satisfy predetermined relationships in connection with the amount of nitrogen, the amount of silicon and the amount of oxygen in the gas barrier layer as measured by an XPS analysis, without having a region in which the amount of nitrogen is larger than the amount of oxygen, can be obtained.

More specifically, in a gas barrier layer formed on a base material, when a first region having excellent mechanical strength, transparency and the like, a second region having excellent gas barrier properties and the like, and a third region having excellent mechanical strength, transparency and the like, are sequentially included from the surface side toward the base material side, without having a region in which the amount of nitrogen is larger than the amount of oxygen, a gas barrier film which is not likely to be colored and has excellent gas barrier properties, transparency and the like can be obtained.

Furthermore, when the blend compositions of the first region to the third region are characterized by an XPS analysis, the specification accuracy is high, the blend compositions are conveniently controlled to predetermined amounts, and thereby predetermined relationships can be satisfied. Therefore, a gas barrier film having stabilized performance can be obtained.

However, it is not required that the interfaces of the first region to the third region included in the gas barrier layer be necessarily clearly defined, and rather, it is preferable that the various regions be in a state that there are portions in which the respective composition ratios change continuously or stepwise.

In other words, it is desirable that in the gas barrier layer, from the surface side toward the base material side, the composition ratios of the various regions change continuously or stepwise, and it be confirmed by an XPS analysis that a first region to a third region having different composition ratios are formed.

Furthermore, on the occasion of constructing the gas barrier film of the present invention, it is preferable that in regard to the total amount of the amount of nitrogen, the amount of silicon and the amount of oxygen (100 mol %; hereinafter, the same) in the first region, the amount of nitrogen measured by an XPS analysis have a value in the range of 0.1 mol % to 10 mol %, the amount of silicon have a value in the range of 25 mol % to 49.9 mol %, and the amount of oxygen have a value in the range of 50 mol % to 74 mol %.

As such, when a gas barrier film is configured in consideration of the amounts of the various elements in the first region, superior transparency can be obtained.

Furthermore, on the occasion of constructing the gas barrier film of the present invention, it is preferable that in regard to the total amount of the amount of nitrogen, the amount of silicon and the amount of oxygen in the second region, the amount of nitrogen measured by an XPS analysis have a value in the range of 0.3 mol % to 30 mol %, the amount of silicon have a value in the range of 25 mol % to 50 mol %, and the amount of oxygen have a value in the range of 20 mol % to 70 mol %.

As such, when a gas barrier film is configured in consideration of the amounts of the various elements in the second region, superior gas barrier properties can be obtained.

Furthermore, on the occasion of constructing the gas barrier film of the present invention, it is preferable that in regard to the total amount of the amount of nitrogen, the amount of silicon and the amount of oxygen in the third region, the amount of nitrogen measured by an XPS analysis have a value in the range of 0.1 mol % to 10 mol %, the amount of silicon have a value in the range of 25 mol % to 49.9 mol %, and the amount of oxygen have a value in the range of 50 mol % to 74 mol %.

As such, when a gas barrier film is configured in consideration of the amounts of the various elements in the third region, superior transparency can be obtained.

Furthermore, on the occasion of constructing the gas barrier film of the present invention, it is preferable that in the first region, the amount of oxygen decreases, while the amount of silicon and the amount of oxygen respectively increase, from the surface side toward the base material side.

Furthermore, on the occasion of constructing the gas barrier film of the present invention, it is preferable that in the second region, the amount of oxygen have a minimum point at which the amount decreases from the surface side toward the base material side and then increases, and also, the amount of silicon and the amount of nitrogen respectively have a maximum point at which each amount increases and then decreases.

Furthermore, on the occasion of constructing the gas barrier film of the present invention, it is preferable that in the third region, the amount of oxygen increases, while the amount of silicon and the amount of nitrogen respectively decrease, from the surface side toward the base material side.

Furthermore, on the occasion of constructing the gas barrier film of the present invention, it is preferable that the refractive index in the first region have a value in the range of below 1.5, the refractive index in the second region have a value of 1.5 or more, and the refractive index in the third region have a value of below 1.5.

Furthermore, on the occasion of constructing the gas barrier film of the present invention, it is preferable that the film density in the first region have a value of below 2.30 $g/cm^3$, the film density in the second region have a value of 2.30 $g/cm^3$ or more, and the film density in the third region have a value of below 2.30 $g/cm^3$.

Furthermore, on the occasion of constructing the gas barrier film of the present invention, it is preferable that the film thickness in the first region have a value in the range of 1 nm to 10 nm, the film thickness in the second region have a value in the range of 5 nm to 30 nm, and the film thickness in the third region have a value in the range of 20 nm to 200 nm.

Furthermore, on the occasion of constructing the gas barrier film of the present invention, it is preferable that the water vapor transmission rate in an atmosphere at 40° C. and 90% RH be 0.5 $g/(m^2 \cdot day)$ or less, and the yellow index YI have a value of 0 to 7.

Furthermore, according to another aspect of the present invention, there is provided a method for producing a gas barrier film by forming a gas barrier layer on a base material, characterized in that the method includes step (1) and step (2):

(1) a polysilazane layer forming step of forming a polysilazane layer on a base material; and (2) a plasma ion implantation step of implanting plasma ions into the polysilazane layer thus obtained, and forming a gas barrier layer which includes, in connection with the amount of nitrogen, the amount of silicon and the amount of oxygen in the gas barrier layer measured by an XPS analysis, when the surface of the gas barrier layer that is in contact with the base material is designated as a base material side, and the opposite surface is designated as a surface side, a first region in the relationship of the amount of oxygen>the amount of silicon>the amount of nitrogen;

a second region in the relationship of the amount of silicon>the amount of oxygen>the amount of nitrogen; and a third region in the relationship of the amount of oxygen>the amount of silicon>the amount of nitrogen, from the surface side toward the base material side.

That is, when a plasma ion implantation method is applied to a polysilazane layer formed on a base material as such, a gas barrier film which is not likely to be colored and has excellent gas barrier properties, transparency and the like can be efficiently obtained.

More specifically, by producing a gas barrier film as such, a gas barrier layer including, from the surface side toward the base material side, a first region to a third region that satisfy predetermined relationships in connection with the amount of nitrogen, the amount of silicon and the amount of oxygen in the gas barrier layer as measured by an XPS analysis, without having a region in which the amount of nitrogen is larger than the amount of oxygen, can be efficiently formed.

Therefore, a gas barrier film having excellent gas barrier properties can be stably obtained.

Furthermore, on the occasion of carrying out the method for producing a gas barrier film of the present invention, it is preferable that the method include, between step (1) and step (2), a seasoning step of seasoning the base material having a polysilazane layer formed thereon.

Furthermore, on the occasion of carrying out the method for producing a gas barrier film of the present invention, it is preferable that the seasoning conditions for step (1) include a temperature in the range of 15° C. to 35° C. and a time in the range of 24 hours to 480 hours.

When a seasoning step is included as such, a gas barrier layer having predetermined first to third regions can be stably formed through the plasma ion implantation process of step (2), and a gas barrier layer which is not likely to be colored and has superior gas barrier properties, transparency and the like can be more reliably obtained.

Furthermore, on the occasion of carrying out the method for producing a gas barrier film of the present invention, it is preferable to use at least one of oxygen, nitrogen, neon, helium, argon and krypton as the plasma ion in step (2).

BEST MODES FOR CARRYING OUT THE INVENTION

First Exemplary Embodiment

A first exemplary embodiment relates to a gas barrier film obtained by forming a gas barrier layer on a base material, characterized in that in connection with the amount of nitrogen, the amount of silicon, and the amount of oxygen measured by an XPS analysis (X-ray photoelectron spectroscopic analysis), when the surface of the gas barrier layer that is in contact with the base material is designated as a base material side, and the opposite surface is designated as a surface side, the gas barrier layer includes:

a first region in the relationship of the amount of oxygen>the amount of silicon>the amount of nitrogen;

a second region in the relationship of the amount of silicon>the amount of oxygen>the amount of nitrogen; and a third region in the relationship of the amount of oxygen>the amount of silicon>the amount of nitrogen, from the surface side toward the base material side.

Hereinafter, the gas barrier film of the present invention will be described specifically with appropriate reference to the drawings.

1. Gas Barrier Layer

Figure 1:
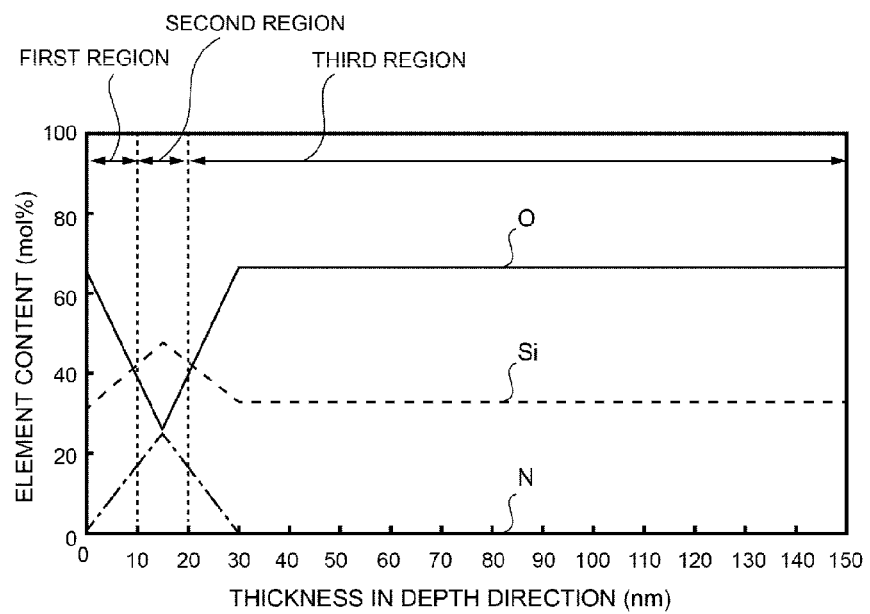
FIG. 1 is a diagram provided to illustrate the amounts of elements (amount of nitrogen, amount of silicon, and amount of oxygen) obtained by analyzing a gas barrier layer in a gas barrier film of Example 1 by an XPS analysis of the thickness in the depth direction.

The gas barrier layer is characterized by including, as illustrated in FIG. 1, in connection with the amount of nitrogen, the amount of silicon, and the amount of oxygen measured by an XPS analysis (X-ray photoelectron spectroscopic analysis), a first region in the relationship of the amount of oxygen>the amount of silicon>the amount of nitrogen; a second region in the relationship of the amount of silicon>the amount of oxygen>the amount of nitrogen; and a third region in the relationship of the amount of oxygen>the amount of silicon>the amount of nitrogen, from the surface side toward the base material side.

That is, when the various regions of the first region to the third region included in the gas barrier layer satisfy the relationship of the amounts of elements such as described above, a gas barrier layer which is not likely to be colored and has excellent gas barrier properties or transparency can be obtained.

(First Region)

The first region formed on the surface side in the gas barrier layer is characterized in that the amount of nitrogen, the amount of silicon, and the amount of oxygen measured by an XPS analysis (X-ray photoelectron spectroscopic analysis) are in the relationship of the amount of oxygen>the amount of silicon>the amount of nitrogen, as illustrated in FIG. 1.

Therefore, in regard to the first region, it is preferable that relative to the total amount (100 mol %) of the amount of nitrogen, the amount of silicon, and the amount of oxygen, the amount of nitrogen measured by an XPS analysis have a value in the range of 0.1 mol % to 10 mol %, the amount of silicon have a value in the range of 25 mol % to 49.9 mol %, and the amount of oxygen have a value in the range of 50 mol % to 74 mol %.

That is, it is because if the amount of nitrogen in the first region has a value of below 0.1 mol %, the amount of oxygen or the amount of silicon is relatively increased, and the balance between the incorporated components is destroyed so that the gas barrier properties may be excessively deteriorated.

On the other hand, it is because if the amount of nitrogen in the first region has a value of above 10 mol %, the amount of oxygen or the amount of silicon is relatively decreased, the balance between the incorporated components is destroyed so that the mechanical strength may be decreased or transparency may be decreased, and further, the refractive index may be increased so that the reflectance may be increased.

Therefore, from the viewpoint of further decreasing the refractive index and further reducing the reflectance, in the first region, it is more preferable that the amount of nitrogen measured by an XPS analysis relative to the total amount of the amount of nitrogen, the amount of silicon and the amount of oxygen, have a value in the range of 0.3 mol % to 7 mol %, and even more preferably a value in the range of 0.5 mol % to 5 mol %.

Furthermore, in the first region, in regard to the amount of silicon measured by an XPS analysis relative to the same total amount, it is more preferable that the amount of silicon have a value in the range of 28 mol % to 45 mol %, and even more preferably a value in the range of 30 mol % to 40 mol %.

In addition, in the first region, in regard to the amount of oxygen measured by an XPS analysis relative to the same total amount, it is more preferable that the amount of oxygen have a value in the range of 62 mol % to 73 mol %, and even more preferably a value in the range of 64 mol % to 72 mol %.

Meanwhile, as illustrated in FIG. 1, the first region is preferably such that the amount of oxygen decreases from the surface side toward the base material side, while the amount of silicon and the amount of nitrogen respectively increase.

The reason for this is that when the composition ratio changes continuously or stepwise in the first region from the surface side toward the base material side as such, transmittance is not likely to be decreased by reflection of light, the gas barrier layer is not likely to be colored, and superior gas barrier properties or transparency is obtained.

(Second Region)

Next, the second region that is formed to be positioned in the middle of the gas barrier layer is characterized in that the amount of nitrogen, the amount of silicon, and the amount of oxygen measured by an XPS analysis are in the relationship of the amount of silicon>the amount of oxygen>the amount of nitrogen, as illustrated in FIG. 1.

Therefore, in the second region, it is preferable that the amount of silicon measured by an XPS analysis relative to the total amount of the amount of nitrogen, the amount of silicon and the amount of oxygen have a value in the range of 25 mol % to 50 mol %, the amount of oxygen have a value in the range of 20 mol % to 70 mol %, and the amount of nitrogen have a value in the range of 0.3 mol % to 30 mol %.

That is, it is because if the amount of nitrogen in the second region has a value of below 0.3 mol %, the amount of silicon or the amount of oxygen is relatively increased, and the balance between the incorporated components is destroyed so that the gas barrier properties may be excessively deteriorated.

On the other hand, it is because if the amount of nitrogen in the second region has a value of above 30 mol %, the amount of silicon or the amount of oxygen is relatively decreased, and the balance between the incorporated components is destroyed so that mechanical strength or transparency may be excessively decreased.

Therefore, in the second region, it is more preferable that the amount of nitrogen measured by an XPS analysis relative to the total amount of the amount of silicon, the amount of oxygen and the amount of nitrogen have a value in the range of 0.5 mol % to 29 mol %, and even more preferably a value in the range of 1 mol % to 28 mol %.

Furthermore, in the second region, in regard to the amount of silicon measured by an XPS measurement relative to the same total amount, it is more preferable that the amount of silicon have a value in the range of 28 mol % to 45 mol %, and even more preferably a value in the range of 30 mol % to 40 mol %.

In addition, in the second region, in regard to the amount of oxygen measured by an XPS analysis relative to the same total amount, it is more preferable that the amount of oxygen have a value in the range of 25 mol % to 69.5 mol %, even more preferably a value in the range of 30 mol % to 69 mol %, and particularly preferably a value in the range of 30 mol % to 49.9 mol %.

Meanwhile, as illustrated in FIG. 1, it is preferable that in the second region, the amount of oxygen have a minimum point at which the amount of oxygen decreases from the surface side toward the base material side and then increases, and also, the amount of silicon and the amount of nitrogen respectively have a maximum point at which each amount increases and then decreases.

The reason for this is that when the composition ratio changes continuously or stepwise in the second region from the surface side toward the base material side as such, transmittance is not likely to be decreased by reflection of light, the gas barrier layer is not likely to be colored, and superior gas barrier properties or transparency is obtained.

(Third Region)

The third region that is formed on the lower part on the side opposite to the surface side in the gas barrier layer, that is, on the base material side, is characterized in that the amount of nitrogen, the amount of silicon, and the amount of oxygen measured by an XPS analysis are in the relationship of the amount of oxygen>the amount of silicon>the amount of nitrogen, as illustrated in FIG. 1.

Therefore, it is preferable that in the third region, the amount of nitrogen measured by an XPS analysis relative to the total amount of the amount of nitrogen, the amount of silicon and the amount of oxygen have a value in the range of 0.1 mol % to 10 mol %, the amount of silicon have a value in the range of 25 mol % to 49.9 mol %, and the amount of oxygen have a value in the range of 50 mol % to 74 mol %.

That is, it is because if the amount of nitrogen in the third region has a value of below 0.1 mol %, the amount of silicon or the amount of oxygen is relatively increased, and the balance between the incorporated components is destroyed so that the gas barrier properties may be excessively decreased.

On the other hand, it is because if the amount of nitrogen in the third region has a value of above 10 mol %, the amount of silicon or the amount of nitrogen is relatively decreased, and the balance between the incorporated components is destroyed so that the mechanical strength may decrease, and flexibility may decrease.

Therefore, from the viewpoint of maintaining the mechanical strength and imparting flexibility, it is more preferable that in the third region, the amount of nitrogen measured by an XPS analysis relative to the total amount of the amount of nitrogen, the amount of silicon and the amount of oxygen have a value in the range of 0.3 mol % to 7 mol %, and even more preferably a value in the range of 0.5 mol % to 5 mol %.

Furthermore, in the third region, in regard to the amount of silicon measured by an XPS analysis relative to the same total amount have a value in the range of 28 mol % to 45 mol %, and even more preferably a value in the range of 30 mol % to 40 mol %.

In addition, in the third region, in regard to the amount of oxygen measured by an XPS analysis relative to the same total amount, it is more preferable that the amount of oxygen have a value in the range of 62 mol % to 73 mol %, and even more preferably a value in the range of 64 mol % to 72 mol %.

Meanwhile, the first to third regions may contain other elements in addition to nitrogen, silicon and oxygen, to the extent that the gas barrier properties and transparency are not impaired. The proportion of other elements is preferably 10 mol % or less, and more preferably 5 mol % or less, relative to the total amount of all the elements.

Meanwhile, as illustrated in FIG. 1, it is preferable that in the third region, the amount of oxygen increase from the surface side toward the base material side, while the amount of silicon and the amount of nitrogen respectively decrease.

The reason for this is that when the composition ratio changes continuously or stepwise from the surface side toward the base material side in the third region as such, transmittance is not likely to be decreased by reflection of light, the gas barrier layer is not likely to be colored, and excellent gas barrier properties or transparency is obtained.

Furthermore, in regard to the refractive indices in the various regions of the gas barrier layer, it is preferable that the refractive index in the first region have a value in the range of below 1.5, the refractive index in the second region have a value of 1.5 or more, and the refractive index in the third region have a value of below 1.5.

The reason for this is that when the refractive indices of the various regions are limited to these values, the reflectance of the gas barrier layer is prevented from increasing, and superior transparency is obtained stably.

Therefore, from the viewpoint of decreasing the reflectance and consequently further increasing the transmittance, it is more preferable that the refractive index in the first region have a value in the range of 1.40 to below 1.5, the refractive index in the second region have a value in the range of 1.5 to 2.1, and the refractive index in the third region have a value in the range of 1.40 to below 1.5.

Furthermore, it is even more preferable that the refractive index in the first region have a value in the range of 1.42 to 1.48, the refractive index in the second region have a value in the range of 1.51 to 2.0, and the refractive index in the third region have a value in the range of 1.42 to 1.48.

Meanwhile, the refractive indices in the various regions are values measured by the method explained in Example 1.

Furthermore, in regard to the film density in the various regions of the gas barrier layer of the present invention, it is preferable that the film density in the first region have a value of below 2.30 $g/cm^3$, the film density in the second region have a value of 2.30 $g/cm^3$ or more, and the film density in the third region have a value of below 2.30 $g/cm^3$.

The reason for this is that when the film densities of the various regions are limited to these values, the gas barrier layer is not likely to be colored, and superior gas barrier properties, transparency and the like are obtained. Furthermore, it is because when the relationship of the film densities of the various regions is defined as such, more specifically, by providing a second region having a high film density between a first region and a second region having low film densities, generation of cracks in the second region is prevented, and bendability and impact absorbability can be imparted to the gas barrier layer.

Therefore, it is more preferable that the film density in the first region have a value in the range of 1.5 to below 2.3 $g/cm^3$, the film density in the second region have a value in the range of 2.3 to 3.5 $g/cm^3$, and the film density in the third region have a value in the range of 1.5 to below 2.3 $g/cm^3$.

Meanwhile, the film densities in the various regions are values measured by the method explained in Example 1.

Furthermore, according to the present invention, it is preferable that the film thickness of the gas barrier layer including the first region to the third region have a value in the range of 30 nm to 200 nm.

The reason for this is that if the film thickness of the gas barrier layer has a value of below 30 nm, it may be difficult to stably form a gas barrier layer including the first region to the third region, and also, the gas barrier properties, mechanical characteristics and the like may be markedly deteriorated.

On the other hand, it is because if the film thickness of the gas barrier layer has a value of above 200 nm, the formation of the gas barrier layer may take an excessively long time, or the adhesiveness to the foundation may deteriorate.

Therefore, it is more preferable that the film thickness of the gas barrier layer including the first region to the third region have a value in the range of 50 nm to 180 nm, and even more preferably a value in the range of 80 nm to 150 nm.

Furthermore, in regard to the film thicknesses for the various regions of the gas barrier layer of the present invention, it is preferable that the film thickness in the first region have a value in the range of 1 nm to 20 nm, and preferably a value in the range of 1 nm to 10 nm; the film thickness in the second region have a value in the range of 1 nm to 30 nm, and preferably a value in the range of 5 nm to 30 nm; and the film thickness in the third region have a value in the range of 20 nm to 200 nm.

The reason for this is that when the film thicknesses of the various regions are adjusted to these ranges as such, the gas barrier layer is not likely to be colored, and superior gas barrier properties, transparency and the like are obtained.

Therefore, it is more preferable that the film thickness in the first region have a value in the range of 1 nm to 20 nm, preferably a value in the range of 1 nm to 10 nm, and even more preferably a value in the range of 1.5 nm to 6 nm; the film thickness in the second region have a value in the range of 1 nm to 30 nm, preferably a value in the range of 5 nm to 30 nm, and even more preferably a value in the range of 10 nm to 25 nm; and the film thickness in the third region have a value in the range of 20 nm to 200 nm, and more preferably a value in the range of 25 nm to 150 nm.

In addition, it is preferable that the film thickness in the first region have a value in the range of 2 nm to 5 nm, the film thickness in the second region have a value in the range of 12 nm to 20 nm, and the film thickness in the third region have a value in the range of 30 nm to 100 nm.

Furthermore, the gas barrier layer in the gas barrier film may be a single layer, or may be plural layers.

For example, when the gas barrier layer is formed into plural layers as a combination of single layers, the gas barrier properties can be further enhanced depending on the use applications.

2. Base Material

The kind of the base material is not particularly limited, and examples include thermoplastic resin films (a polyester film, a polyolefin film, a polycarbonate film, and the like), thermosetting resin films (an epoxy resin film, a silicone resin film, a phenolic resin film, and the like), photocurable resin films (a photocurable acrylic resin film, a photocurable urethane resin film, a photocurable epoxy resin film, and the like), glass, and ceramics. These may be formed into single layers, or may be laminated.

Furthermore, the thickness of the base material is also not particularly limited, and usually, the thickness preferably has a value in the range of 0.5 µm to 1000 µm, more preferably a value in the range of 1 µm to 300 µm, and even more preferably a value in the range of 10 µm to 100 µm.

3. Other Layers

Furthermore, the gas barrier film of the present invention can be provided with various other layers as necessary.

Examples of such other layers include a primer layer, a planarizing layer, a conductive layer, a hard coat layer, a protective layer, an antistatic layer, an anti-fouling layer, an anti-glare layer, a color filter, an adhesive layer, a decorative layer, a print layer, and other gas barrier layers.

Here, the primer layer is a layer provided in order to enhance the adhesiveness of the base material and the gas barrier layer, and for example, known materials such as a urethane-based resin, an acrylic resin, a silane coupling agent, an epoxy-based resin, a polyester-based resin, and an ultraviolet-curable resin, can be used.

Furthermore, the conductive layer may be provided on the gas barrier layer, or may be provided on the base material, and examples of the material that constitutes such a conductive layer (conductive material) include a metal, an alloy, a metal oxide, and a conductive polymer compound.

Further, among these conductive materials, a metal oxide is preferred from the viewpoint of having more satisfactory conductivity and excellent transparency. More specific examples of suitable metal oxides include ITO, gallium-doped zinc oxide (GZO), $ZnO_2$-based compounds, CdO-based compounds, and $SnO_2$-based compounds.

4. Gas Barrier Film

Figure 2:
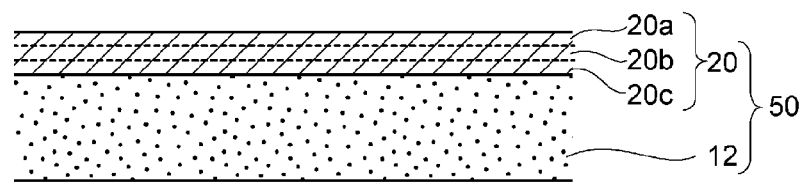
FIG. 2 is a diagram provided to illustrate the cross-section of a gas barrier film which includes a gas barrier layer originating from a polysilazane compound layer.
Figure 3A:
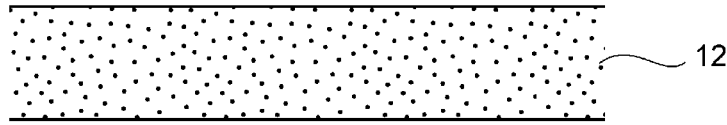
FIGS. 3(a) to 3(e) are diagrams provided to illustrate a method for producing a gas barrier film of the present invention.
Figure 3B:
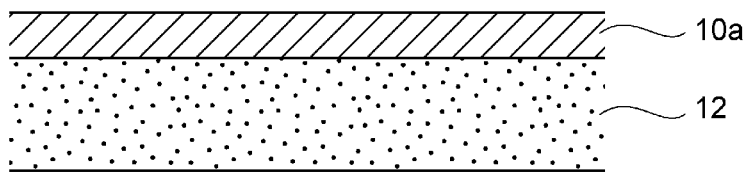
Figure 3C:
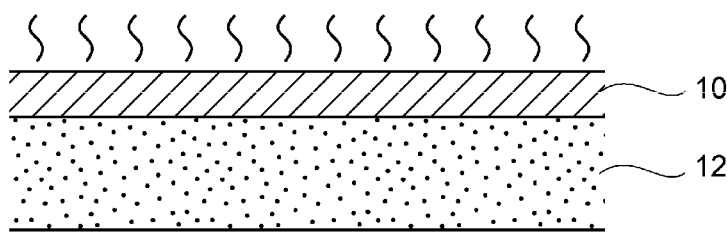
Figure 3D:
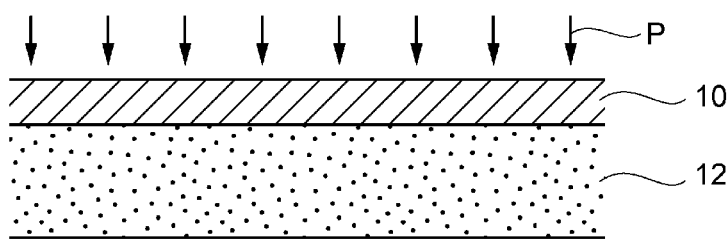
Figure 3E:
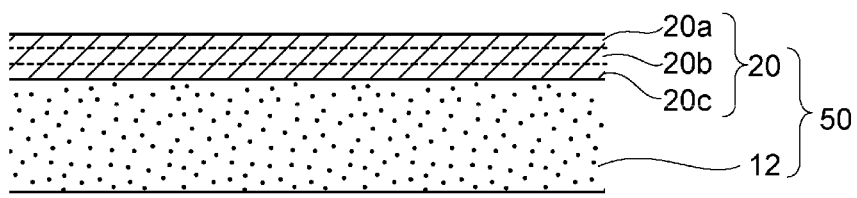

A gas barrier film 50 having the various constituent elements described above is a gas barrier film produced by forming a gas barrier layer 20 on a base material 12 as illustrated in FIG. 2, and the gas barrier layer 20 is configured to include a first region 20a, a second region 20b, and a third region 20c having particular composition ratios that are measured by an XPS analysis, from the surface side toward to the base material side, without having a region in which the amount of nitrogen is larger than the amount of oxygen.

Accordingly, the gas barrier film 50 of the present invention has a feature of having superior gas barrier properties compared with conventional gas barrier films that are formed by laminating gas barrier layers.

Furthermore, the gas barrier film has a feature that in the first to third regions, as the composition ratio changes continuously or stepwise, transmittance is not likely to be decreased by reflection of light.

Furthermore, the water vapor transmission rate of the gas barrier film 50 of the present invention has a value of 0.5 g/($m^2$·day) or less, preferably a value of 0.1 g/($m^2$·day) or less, and more preferably a value of 0.05 g/($m^2$·day) or less, in an atmosphere at 40° C. and 90% RH, and it is preferable that the gas barrier film 50 have highly excellent gas barrier properties.

Furthermore, the total light transmittance of the gas barrier film 50 of the present invention is 80% or higher, and preferably 85% or higher.

Furthermore, the degree of yellowness (b*) of the gas barrier film 50 of the present invention in the CIE1976 L*a*b* color coordinate system is in the range of −5.0 to 5.0, preferably in the range of −4.0 to 4.0, and more preferably in the range of −3.0 to 3.0. Furthermore, the yellow index (YI) is in the range of 0 to 7, preferably in the range of 0 to 6, and more preferably in the range of 0 to 5.

Moreover, the gas barrier film may be used in the form of a single layer as illustrated in FIG. 2, or though not shown in the diagram, a laminate of two or more sheets of the gas barrier film of FIG. 2 may also be used.

When two or more sheets of the gas barrier film are laminated, the order of lamination and the direction of facing are not particularly limited, but from the viewpoint of protecting the surface of the gas barrier layer and preventing a decrease in the gas barrier properties, it is preferable to laminate the gas barrier layer 20 surfaces of FIG. 2 by pasting the surfaces with an adhesive or the like.

5. Method for Forming Gas Barrier Layer

Furthermore, regarding the method for forming a gas barrier layer, there are no particular limitations as long as the relationship of the characteristic values of the various regions as described above is achieved.

Therefore, examples of the method for forming a gas barrier layer include known film-forming methods such as a sputtering method, a vacuum deposition method, an ion plating method, a plasma CVD method, an atmospheric pressure plasma CVD method, and a coating method.

That is, as illustrated in FIG. 2, a gas barrier film 50 having a gas barrier layer 20 which includes a first region to a third region can be obtained by forming the third region 20c, the second region 20b, and the first region 20a, each having a predetermined composition ratio, on a base material 12 in sequence from the lower part, by the method described above.

Alternatively, as will be disclosed by the method for producing a gas barrier film that will be described below, a gas barrier film can also be produced by forming a gas barrier layer which includes a first region to a third region having different composition ratios, by forming a polysilazane layer on a base material, and subjecting the polysilazane compound to a plasma ion implantation method.

Second Embodiment

A second embodiment relates to a method for producing a gas barrier film by forming a gas barrier layer on a base material, characterized by including the following step (1) and step (2):

(1) a polysilazane layer forming step of forming a polysilazane layer on a base material; and (2) a plasma ion implantation step of implanting plasma ions into the polysilazane layer thus obtained, and forming a gas barrier layer which includes, in connection with the amount of nitrogen, the amount of silicon and the amount of oxygen in the gas barrier layer measured by an XPS analysis, when the surface of the gas barrier layer that is in contact with the base material is designated as a base material side, and the opposite surface is designated as a surface side, a first region in the relationship of the amount of oxygen>the amount of silicon>the amount of nitrogen;

a second region in the relationship of the amount of silicon>the amount of oxygen>the amount of nitrogen; and a third region in the relationship of the amount of oxygen>the amount of silicon>the amount of nitrogen, from the surface side toward the base material side.

1. Step (1): Polysilazane Layer Forming Step

Step (1) is a process of preparing a base material 12 intended to acquire gas barrier properties as illustrated in FIG. 3(*a*), and forming a polysilazane layer 10*a* on the base material 12 thus prepared, as illustrated in FIG. 3(*b*).

(1) Polysilazane Compound

The polysilazane compound for forming the polysilazane layer is a polymer compound having a repeating unit containing a —Si—N— bond (silazane bond) in the molecule, and any known compound such as an organic polysilazane, an inorganic polysilazane or a modified polysilazane can be used.

Furthermore, the compounds of manufactured products those are commercially available as glass coating agents or the like can also be directly used as the polysilazane compound.

Although various polysilazane compounds have been listed as examples, among them, an inorganic polysilazane is preferred, and it is particularly preferable to use a perhydropolysilazane.

It is because when a perhydropolysilazane is used, the refractive index (nd1) of the polysilazane compound can be easily controlled, and when a gas barrier film is obtained according to a plasma ion implantation method, superior gas barrier properties or mechanical characteristics can be obtained.

(2) Method for Forming Polysilazane Layer

Furthermore, there are no particular limitations on the method for forming a polysilazane layer, and any known method can be used. Examples include a method of forming a polysilazane layer on a base material by a known coating method such as a screen printing method, a knife coating method, a roll coating method, a die coating method, an inkjet method, or a spin coating method; and a method forming a polysilazane layer by bringing a gas of a plasma-polymerizable silazane compound into contact with a base material, and applying a plasma polymerization treatment thereto.

Among them, it is preferable, in order to form a polysilazane layer having a uniform thickness, that a polysilazane layer be formed by applying a coating liquid of a polysilazane compound blended with an organic solvent, on a base material or the like by a known coating method such as a screen printing method, a knife coating method, a roll coating method, a die coating method, an inkjet method or a spin coating method, and drying the coating liquid.

In addition, regarding the base material to be used, the same matters as those described above in relation to the gas barrier film are applicable.

(3) Seasoning Step

Furthermore, the seasoning step (post curing) is an optional process, and is a process of subjecting the base material having the polysilazane layer 10*a* formed thereon, to a seasoning treatment under predetermined conditions as illustrated in FIG. 3(*c*), and obtaining a polysilazane layer 10 having a predetermined refractive index or the like.

Here, the seasoning conditions are preferably treatment conditions including a temperature of 15° C. to 35° C. and a treatment time of 24 hours to 480 hours, and more preferably treatment conditions including a temperature of 20° C. to 30° C. and a treatment time of 48 hours to 240 hours.

That is, it is because when the temperature or treatment time of the seasoning conditions is adjusted to such a range, the composition ratio of the gas barrier layer obtainable after the subsequent plasma ion implantation step can be stably regulated, and excellent gas barrier properties can be obtained.

Furthermore, the refractive index of the polysilazane layer 10 can be limited to a predetermined range by the seasoning step, but more specifically, the refractive index is preferably adjusted to a value in the range of 1.48 to 1.63.

The reason for this is that when the refractive index of the polysilazane layer 10 is limited to a value in a predetermined range, in a case in which a gas barrier film including a gas barrier layer originating from a polysilazane layer is obtained by a plasma ion implantation method in step (2), the gas barrier film is not likely to be colored, and excellent gas barrier properties, transparency and the like can be obtained.

That is, it is because if the refractive index of the polysilazane layer 10 has a value of below 1.48, the gas barrier properties of the gas barrier layer obtainable after the plasma ion implantation step may be deteriorated, and if the refractive index has a value of above 1.63, transparency of the gas barrier layer obtainable after the plasma ion implantation step may be decreased.

Therefore, it is more preferable to adjust, by the seasoning step, the refractive index of the polysilazane layer 10 to a value in the range of 1.49 to 1.59, and more preferably to a value in the range of 1.50 to 1.58.

2. Step (2): Plasma Ion Implantation Step (1) Basic Method

Step (2) is a process of subjecting the polysilazane layer 10 to a plasma ion implantation method as illustrated in FIG. 3(*d*); implanting ions that are present in a plasma generated by an external electric field as indicated by arrow P; and finally forming a gas barrier layer 20 that includes a first region 20*a*, a second region 20*b*, and a third region 20*c* from the surface side toward the base material side, as illustrated in FIG. 3(*e*).

Regarding the first region 20*a*, the second region 20*b*, and the third region 20*c*, the same matters as those described above are applicable.

More specifically, the basic method for the plasma ion implantation method involves generating plasma in an atmosphere containing a plasma generating gas such as a noble gas, applying a negative high voltage pulse thereto, and thereby implanting ions (cations) in the plasma into the polysilazane layer 10.

Furthermore, more specifically, examples of the plasma ion implantation method include a method of implanting ions (that is, plasma ions) present in a plasma generated using an external electric field, into the polysilazane layer 10; and a method of implanting ions present in a plasma generated, without using an external electric field, but only with an electric field by the negative high voltage pulse applied to the polysilazane layer 10, into the polysilazane layer 10.

Furthermore, when ions in plasma are implanted into the polysilazane layer 10, a known plasma ion implantation apparatus can be used, and for example, the plasma ion implantation apparatuses described in JP 2001-26887 A, JP 2001-156013 A, and WO 2010/021326 can be used.

Figure 4:
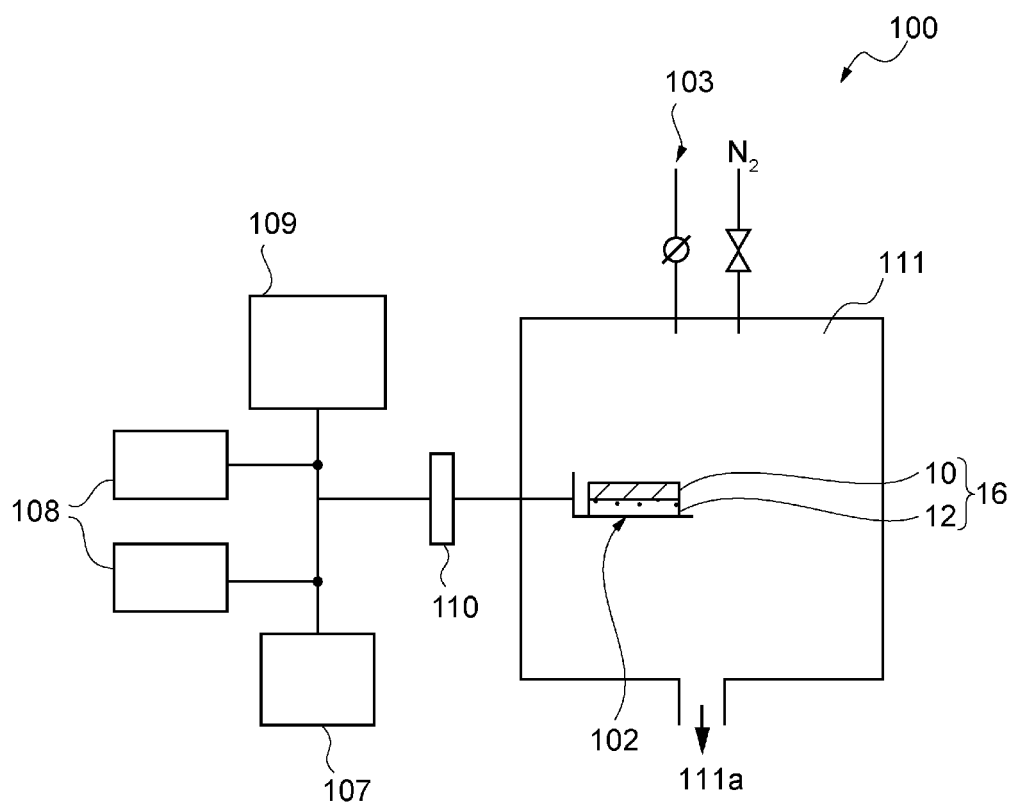
FIG. 4 is a diagram provided to illustrate an example of an ion implantation apparatus.
Figure 5A:
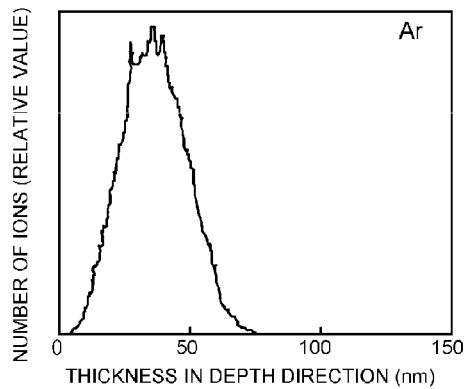
FIGS. 5(a) to 5(f) are diagrams provided to illustrate the relationship between the depth (nm) from the surface side and the number of ions obtained by Monte Carlo simulation, with regard to the ion species (Ar, Kr, He, N, Ne and O)
Figure 5B:
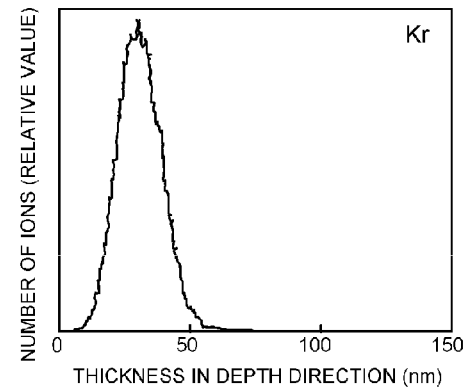
Figure 5C:
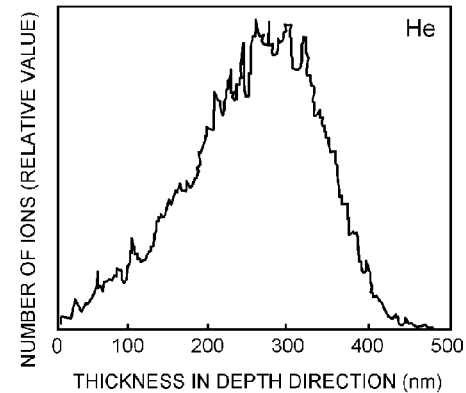
Figure 5D:
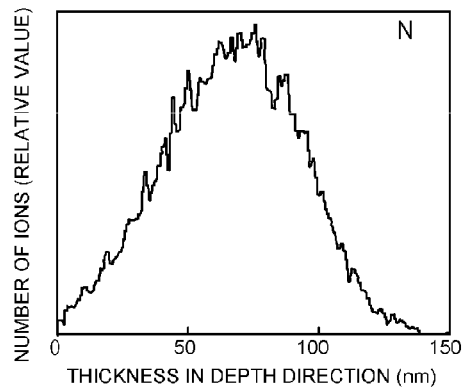
Figure 5E:
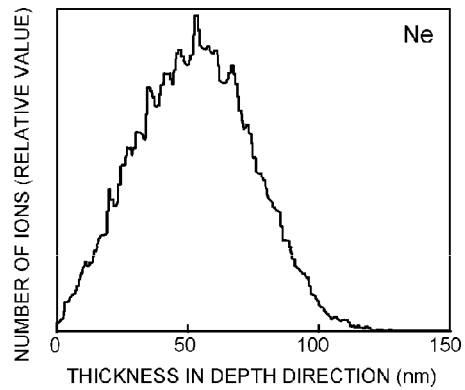
Figure 5F:
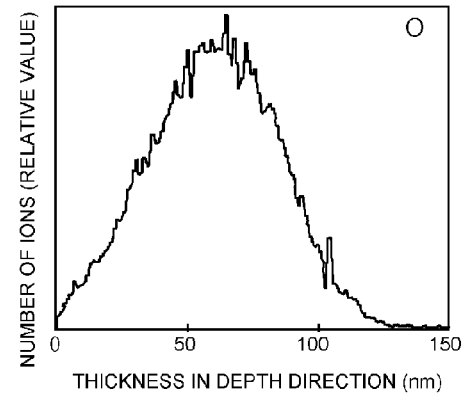

In the following, an outline of the plasma ion implantation method will be described by taking the plasma ion implantation apparatus 100 illustrated in FIG. 4 as an example.

That is, such a plasma ion implantation apparatus 100 basically includes a vacuum chamber 111; a microwave power supply (not shown in the diagram); a magnet coil (not shown in the diagram); a direct current application apparatus 108; and a high frequency pulse power supply 109.

The vacuum chamber 111 is a vessel intended for disposing a base material 12 having a polysilazane layer 10 formed on a base material 12, which is an object to be treated (hereinafter, may be simply referred to as a base material film 16), at a predetermined position inside the vessel, and also for performing implantation of ions originating from a predetermined gas introduced through a gas inlet port 103, to the base material. Furthermore, the vacuum chamber 111 includes an exhaust hole 111a for exhausting the internal air or the predetermined gas that has been introduced, after use, in the direction indicated with an arrow.

Also, the direct current application apparatus 108 is a direct current power supply equipped with an oscilloscope 107, and is a pulse power supply intended for applying a high voltage pulse to the base material film 16, which is the object to be treated.

Therefore, the direct current application apparatus 108 is electrically connected to a conductor 102 that has the base material film 16, which is the object to be treated, disposed thereon.

Accordingly, when a plasma ion implantation apparatus 100 configured as such is used, plasma of a predetermined gas is generated around the conductor 102 and the base material film 16, by driving the microwave power supply (electrode for plasma discharge) and the magnet coil.

Subsequently, after the passage of a predetermined time period, driving of the microwave power supply (not shown in the diagram) and the magnet coil (not shown in the diagram) is stopped, and at the same time, the direct current application apparatus 108 is driven. Thus, a predetermined high voltage pulse (negative voltage) is applied, through a high voltage input terminal 110 and the conductor 102, to the base material 12 having a polysilazane layer 10 formed thereon, which is the object to be treated.

Therefore, as a result of the application of such a high voltage pulse (negative voltage), ion species in the plasma are induced to be implanted into the polysilazane layer 10, and thereby a gas barrier film having a gas barrier layer on a base material can be obtained.

Meanwhile, although not shown in the diagram, in an implantation apparatus for continuously implanting plasma ions, a lengthy base material 12 on which a layer 10 formed of a polysilazane compound is formed, can be conveyed and subjected to plasma ion implantation in sequence.

(2) Ion Species

There are no particular limitations on the ion species that are introduced into the vacuum chamber described above and are further implanted into the polysilazane layer; however, examples thereof include ions of noble gases such as argon, helium, neon, krypton and xenon; ions of fluorocarbons, hydrogen, nitrogen, oxygen, carbon dioxide, chlorine, fluorine and sulfur; ions of alkane-based gases such as methane, ethane, propane, butane, pentane and hexane; ions of alkene-based gases such as ethylene, propylene, butene and pentene; ions of alkadiene-based gases such as pentadiene and butadiene; ions of alkyne-based gases such as acetylene and methylacetylene; ions of aromatic hydrocarbon-based gases such as benzene, toluene, xylene, indene, naphthalene and phenanthrene; ions of cycloalkane-based gases such as cyclopropane and cyclohexane; ions of cycloalkene-based gases such as cyclopentene and cyclohexene; ions of conductive metals such as gold, silver, copper, platinum, nickel, palladium, chromium, titanium, molybdenum, niobium, tantalum, tungsten and aluminum; and ions of silane ($SiH_4$) or organosilicon compounds.

Among these, from the viewpoint that the ions can be implanted more conveniently, and a gas barrier layer having especially excellent gas barrier properties is obtained, ions of at least one kind selected from the group consisting of hydrogen, nitrogen, oxygen, argon, helium, neon, xenon and krypton are preferred.

Particularly, as illustrated in FIG. 5(a) to FIG. 5(e), argon (Ar), krypton (Kr), helium (He), nitrogen (N), neon (Ne) and oxygen (O) are suitable as the ion species to be implanted, because the fluctuation in the number of ions calculated by Monte Carlo simulation (a numerical analysis performed using random numbers) with respect to the thickness (nm) in the depth direction is small for each ion species, and it has been found that ions can be implanted into a predetermined depth position.

Meanwhile, the ion species that are implanted into the polysilazane layer, that is, the gas for ion implantation, acquires a function as a plasma generating gas.

(3) Plasma Ion Implantation Pressure

Furthermore, it is preferable to adjust the pressure of the vacuum chamber at the time of performing ion implantation, that is, the plasma ion implantation pressure, to a value in the range of 0.01 Pa to 1 Pa.

The reason for this is that when the pressure at the time of such plasma ion implantation is in such a range, ions can be uniformly implanted conveniently and efficiently, and a gas barrier layer having both bendability and gas barrier properties can be formed efficiently.

Therefore, the plasma ion implantation pressure is more preferably adjusted to a value in the range of 0.02 Pa to 0.8 Pa, and even more preferably to a value in the range of 0.03 Pa to 0.6 Pa.

(4) Voltage Applied for Plasma Ion Implantation

Furthermore, it is preferable to adjust the voltage applied when ion implantation is performed (high voltage pulse/negative voltage) to a value in the range of −1 kV to −50 kV.

The reason for this is that when ion implantation is carried out with such an applied voltage having an absolute value smaller than −1 kV, the amount of ion implantation (dosage amount) may become insufficient, and desired gas barrier properties may not be obtained.

On the other hand, it is because when ion implantation is carried out with an applied voltage having an absolute value larger than −50 kV, the film may be charged at the time of ion implantation, defects such as coloration of the film may occur, and desired gas barrier properties may not be obtained.

Therefore, it is more preferable to adjust the voltage applied when ion implantation is performed, to a value in the range of −1 kV to −30 kV, and more preferably to a value in the range of −5 kV to −20 kV.

EXAMPLES

Hereinafter, the present invention will be described in more detail by way of

Example 1

1. Production of Gas Barrier Film (1) Step 1: Polysilazane Layer Forming Step

A perhydropolysilazane-containing liquid (solvent: xylene, concentration: 10% by weight) as a starting raw material was applied on a polyester film (manufactured by Toyobo Co., Ltd., A-4100) having a thickness of 50 μm as a base material, using a spin coater (manufactured by Mikasa Co., Ltd., MS-A200, speed of rotation: 3000 rpm, rotation time: 30 seconds).

Subsequently, the liquid was heated and dried at 120° C. to for 2 minutes, and thus a polysilazane layer was formed. Subsequently, the polysilazane layer was left to stand for 48 hours in an environment at 23° C. and 50% RH and was subjected to a seasoning treatment, and thus a polysilazane layer having a thickness of 150 nm and a refractive index of 1.5505 was formed.

(2) Step 2: Plasma Ion Implantation Step

Subsequently, the polysilazane layer obtained in step 1 was subjected to plasma ion implantation under the conditions described below, using a plasma ion implantation apparatus (RF power supply: manufactured by JEOL, Ltd., RF56000, high voltage pulse power supply: Kurita Seisakusho Co., Ltd., PV-3-HSHV-0835), and a gas barrier layer was formed. Thus, a gas barrier film of Example 1 was obtained.

Chamber internal pressure: 0.2 Pa
Gas introduced: argon
RF power output: 1000 W
RF frequency: 1000 Hz
RF pulse width: 50 μsec
RF delay: 25 nsec
DC voltage: −10 kV
DC frequency: 1000 Hz
DC pulse width: 5 μsec
DC delay: 50 μsec
Duty ratio: 0.5%
Treatment time: 300 sec 3. Evaluation of Gas Barrier Film The gas barrier film thus obtained was subjected to the following evaluations.

(1) Evaluation 1 (Elemental Analysis by XPS)

An elemental analysis of silicon, nitrogen and oxygen in the depth direction of the gas barrier layer in the gas barrier film thus obtained was carried out using an XPS analyzer (manufactured by ULVAC-PHI, Inc., QUANTUM 2000). An element content chart thus obtained by an XPS analysis is presented in FIG. 1.

Furthermore, from such an element content chart, it was confirmed whether a first region, a second region and a third region, each having a predetermined composition ratio, are formed in the gas barrier layer. The results thus obtained are presented in Table 1.

(2) Evaluation 2 (Refractive Index)

The gas barrier layer in the gas barrier film thus obtained was divided into a first region, a second region, and a third region, and the refractive indices were respectively measured using a spectroscopic ellipsometer (manufactured by J.A. Woollam Japan Corp.). The results thus obtained are presented in Table 1.

Meanwhile, the thickness of each region was calculated based on the film thickness measured by XPS.

(3) Evaluation 3 (Film Density)

The gas barrier layer in the gas barrier film thus obtained was divided into a first region, a second region, and a third region, and the film densities were respectively measured using an X-ray diffraction apparatus (manufactured by Rigaku Corp., fully automated horizontal type multi-purpose X-ray diffraction apparatus, Smart Lab). The results thus obtained are presented in Table 1.

Meanwhile, the film density of each region was measured based on the film thickness measured by XPS.

(4) Evaluation 4 (Water Vapor Transmission Rate/WVTR)

The water vapor transmission rate under the conditions of RH 90% and 40° C. of the gas barrier film thus obtained was measured using a water vapor transmission rate analyzer (manufactured by Mocon, Inc., AQUATRAN). The results thus obtained are presented in Table 1.

(5) Evaluation 5 (Total Light Transmittance/T.t.)

The total light transmittance (T.t.) of the gas barrier film thus obtained was measured according to JIS K 7631-1, using a turbidimeter (manufactured by Nippon Denshoku Industries Co., Ltd., HAZE METER NDH5000). The results thus obtained are presented in Table 1.

(6) Evaluation 6 (Yellow Index (YI)) and Evaluation 7 (b*)

The yellow index (YI) and b* (value on the b* axis in the CIE1976 L*a*b* color coordinate system) of the gas barrier film thus obtained were respectively measured according to JIS K 7105, using a spectroscopic colorimeter (manufactured by Nippon Denshoku Industries Co., Ltd., SPECTRO COLOR METER SQ2000). The results thus obtained are presented in Table 1.

Meanwhile, the YI and b* are values respectively expressed by the following formulas.

$$YI=100(1.28X-1.067Z)/Y,$$

wherein X and Y are tristimulus values in the XYZ coordinate system of a sample measured using a colorimeter.

$$b^*=200[(Y/Yn)^{1/3}-(Z/Zn)^{1/3}],$$

wherein Y and Z are tristimulus values in the XYZ coordinate system of a sample measured using a colorimeter; and Yn and Zn are tristimulus values at a perfect reflecting diffuser.

Example 2

Figure 6:
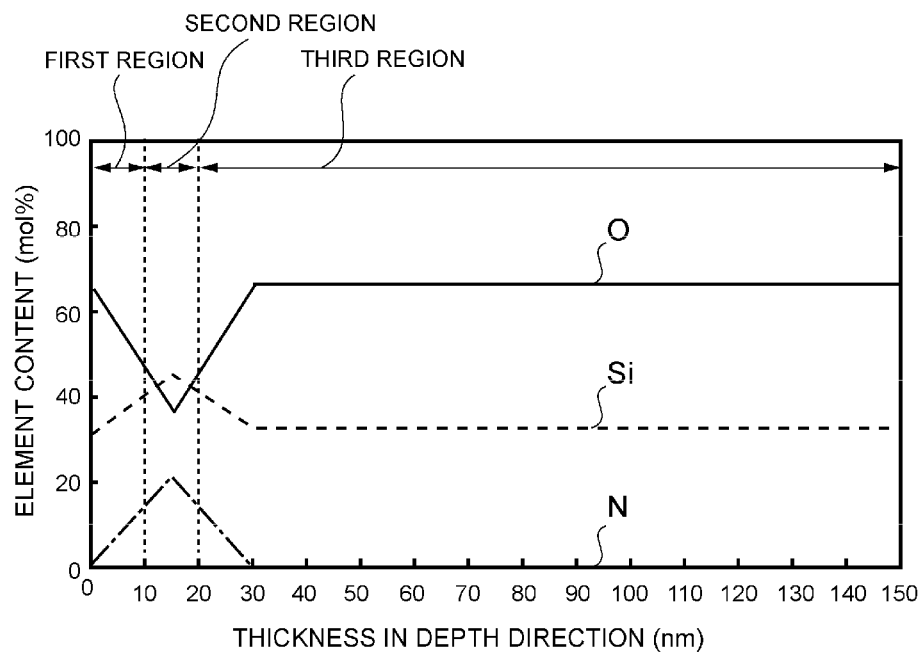
FIG. 6 is a diagram provided to illustrate the amounts of elements (amount of nitrogen, amount of silicon, and amount of oxygen) measured by an XPS analysis of the thickness in the depth direction in a gas barrier film of Example 2.

In Example 2, a gas barrier film was produced in the same manner as in Example 1, except that the DC voltage at the time of plasma ion implantation in step 2 was changed to −9 kV, and the gas barrier film was produced. The results thus obtained are presented in Table 1, and an element content chart by an XPS analysis thus obtained is presented in FIG. 6.

Example 3

Figure 8:
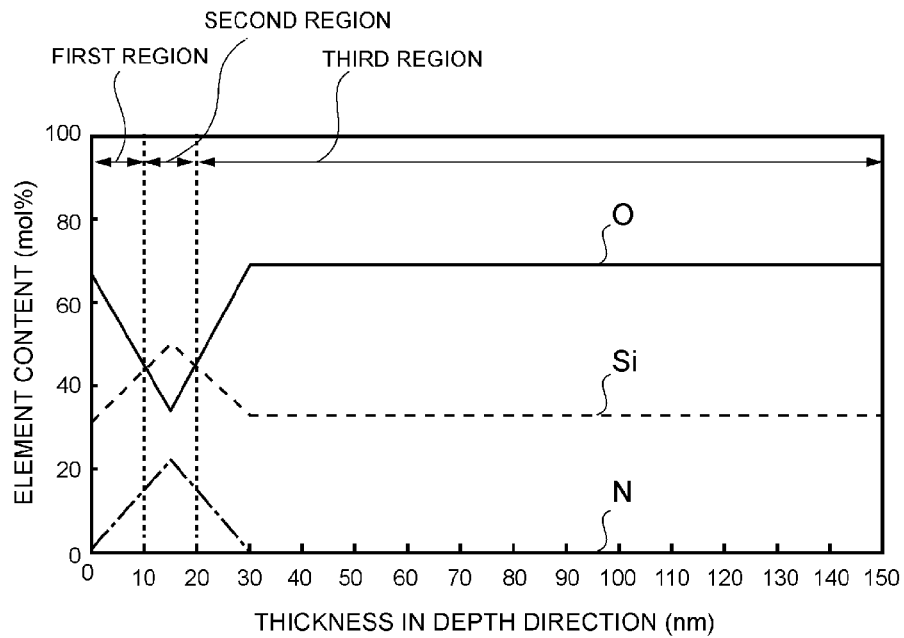
FIG. 8 is a diagram provided to illustrate the amounts of elements (amount of nitrogen, amount of silicon, and amount of oxygen) measured by an XPS analysis of the thickness in the depth direction in a gas barrier film of Example 3.

In Example 3, a gas barrier film was produced in the same manner as in Example 1, except that the seasoning treatment of the polysilazane layer was carried out by leaving the polysilazane layer to stand for 5 days in an environment at 23° C. and 50% RH, and the gas barrier film was evaluated. At this time, the refractive index of the polysilazane layer before plasma ion implantation was 1.5249. The results thus obtained are presented in Table 1, and an element content chart by an XPS analysis thus obtained is presented in FIG. 8.

Comparative Example 1

Figure 9:
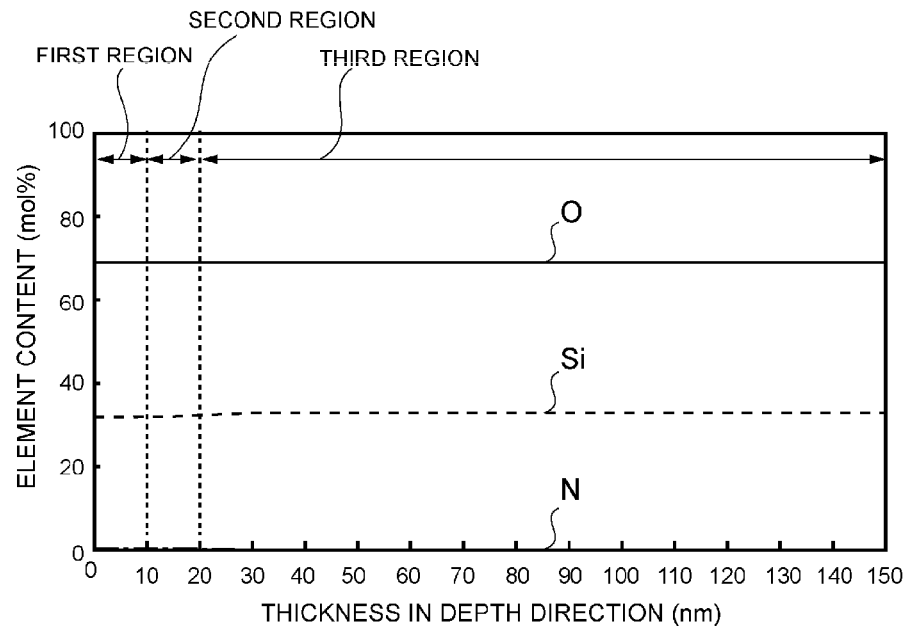
FIG. 9 is a diagram provided to illustrate the amounts of elements (amount of nitrogen, amount of silicon, and amount of oxygen) measured by an XPS analysis of the thickness in the depth direction in a gas barrier film of Comparative Example 1.

In Comparative Example 1, a gas barrier film was produced in the same manner as in Example 1, except that the seasoning treatment of the polysilazane layer was carried out by leaving the polysilazane layer to stand for 20 days in an environment at 23° C. and 50% RH, and the gas barrier film was evaluated. At this time, the refractive index of the polysilazane layer before plasma ion implantation was 1.4601. The results thus obtained are presented in Table 1, and an element content chart by an XPS analysis thus obtained is presented in FIG. 9.

Comparative Example 2

Figure 7:
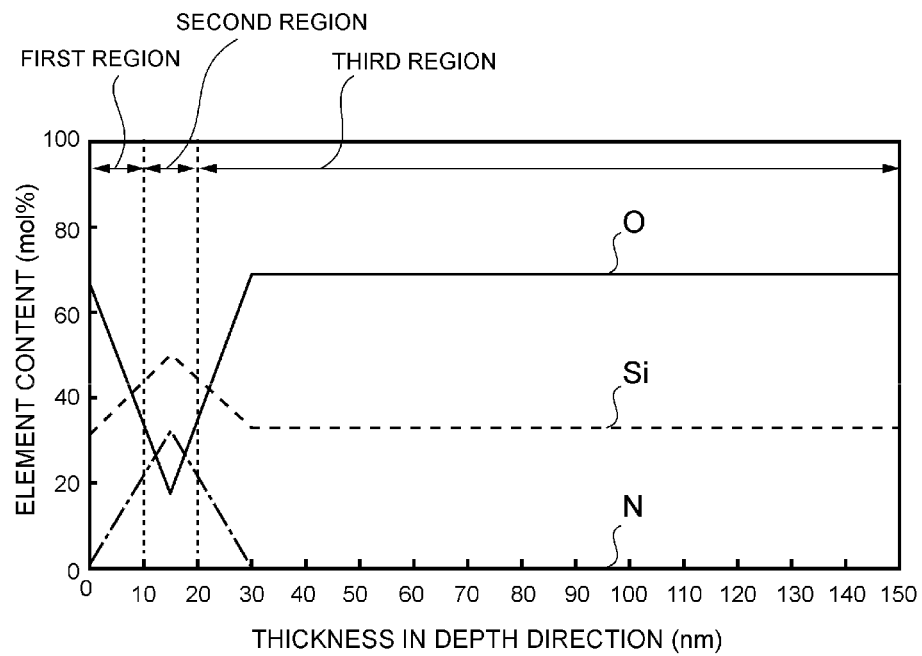
FIG. 7 is a diagram provided to illustrate the amounts of elements (amount of nitrogen, amount of silicon, and amount of oxygen) measured by an XPS analysis of the thickness in the depth direction in a gas barrier film of Comparative Example 2.

In comparative Example 2, a gas barrier film was produced in the same manner as in Example 1, except that a seasoning treatment of the polysilazane layer was not carried out, and the gas barrier film was evaluated. At this time, the refractive index of the polysilazane layer before plasma ion implantation was 1.5914. The results thus obtained are presented in Table 1, and an element content chart by an XPS analysis thus obtained is presented in FIG. 7.

From Table 1, the gas barrier films of Examples 1 to 3 each had a gas barrier layer including a first region to a third region that satisfied predetermined composition ratios, and therefore, the gas barrier films had excellent gas barrier properties and transparency, with decreased coloration.

On the other hand, since the gas barrier film of Comparative Example 1 did not have a gas barrier layer with varying composition ratios, the gas barrier film had excellent transparency with reduced coloration, but exhibited poor gas barrier properties.

Furthermore, the gas barrier film of Comparative Example 2 acquired a gas barrier layer having varying composition ratios, but the composition ratio of the second region was not in the predetermined range.

Furthermore, although the water vapor transmission rate was excellent, the YI (−) had a value of 7 or greater, and b* had a value of 3.0 or greater, so that slight coloration was observed.

a third region, respectively having different composition ratios based on an XPS analysis, can be produced easily and stably with high precision.

EXPLANATIONS OF LETTERS OR NUMERALS

10a: POLYSILAZANE LAYER
20: GAS BARRIER LAYER
20a: FIRST REGION
20b: SECOND REGION
20c: THIRD REGION
12: BASE MATERIAL
50: GAS BARRIER FILM
100: PLASMA ION IMPLANTATION APPARATUS
16: BASE MATERIAL FILM (BASE MATERIAL 12 HAVING POLYSILAZANE LAYER 10 FORMED THEREON)
102: CONDUCTOR
103: GAS INLET PORT
107: OSCILLOSCOPE
108: DIRECT CURRENT APPLICATION APPARATUS (PULSE POWER SUPPLY)
109: HIGH VOLTAGE PULSE
110: HIGH VOLTAGE INPUT TERMINAL
111: VACUUM CHAMBER

TABLE 1

|  | Example 1 | Example 2 | Example 3 | Comparative Example 1 | Comparative Example 2 |
|---|---|---|---|---|---|
| Refractive index (−) of polysilazane layer | 1.5505 | 1.5505 | 1.5249 | 1.4601 | 1.5914 |
| Plasma ion implantation pressure (V) | −10 | −9 | −10 | −10 | −10 |
| Elemental analysis by XPS |  |  |  |  |  |
| First region | O > Si > N | O > Si > N | O > Si > N | O > Si > N | O > Si > N |
| Second region | Si > O > N | Si > O > N | Si > O > N | O > Si > N | Si > N > O |
| Third region | O > Si > N | O > Si > N | O > Si > N | O > Si > N | O > Si > N |
| Refractive index (−) of gas barrier layer |  |  |  |  |  |
| First region | 1.4711 | 1.4713 | 1.4686 | 1.4511 | 1.4731 |
| Second region | 1.8509 | 1.7088 | 1.8311 | 1.4511 | 1.8912 |
| Third region | 1.4663 | 1.4595 | 1.4551 | 1.4511 | 1.4542 |
| Film density (g/cm$^3$) of gas barrier layer |  |  |  |  |  |
| First region | 2.28 | 2.29 | 2.16 | 2.01 | 2.31 |
| Second region | 3.28 | 3.11 | 3.11 | 2.01 | 3.55 |
| Third region | 2.27 | 2.30 | 2.11 | 2.01 | 2.24 |
| WVTR (g/(m$^2$ · day)) | 0.0112 | 0.0150 | 0.0142 | 5.4100 | 0.0013 |
| Tt (%) | 86.34 | 87.54 | 87.24 | 92.5 | 85.11 |
| Yl (−) | 6.13 | 4.72 | 4.81 | 0.30 | 7.21 |
| b* (−) | 3.07 | 2.33 | 2.39 | 0.11 | 3.71 |

INDUSTRIAL APPLICABILITY

As discussed above, according to the present invention, in a gas barrier film obtained by forming a gas barrier layer on a base material, when the gas barrier layer is configured to include a first region, a second region and a third region that respectively have different composition ratios as analyzed by an XPS analysis, a gas barrier film having highly excellent gas barrier properties can be obtained efficiently.

More specifically, a gas barrier film having excellent transparency, in which the water vapor transmission rate (WVTR) of the gas barrier film has a very low value of 0.015 g/(m$^2$·day) or less, the total light transmittance (T.t.) is 85% or higher, the yellow index (YI) is 7 or less, and b* has a value of 3.0 or less, has come to be obtained.

Moreover, according to the production method of the present invention, a gas barrier layer including a first region to

The invention claimed is:

1. A gas barrier film, comprising a gas barrier layer formed on a base material,
wherein the gas barrier layer contains at least oxygen atoms, silicon atoms and nitrogen atoms, and in connection with an amount of nitrogen, an amount of silicon and an amount of oxygen in the gas barrier layer measured by an XPS analysis, when a surface of the gas barrier layer that is in contact with the base material is designated as a base material side, and the opposite surface is designated as a surface side, the gas barrier layer includes:
a first region in the relationship of the amount of oxygen>the amount of silicon>the amount of nitrogen;
a second region in the relationship of the amount of silicon>the amount of oxygen>the amount of nitrogen;
a third region in the relationship of the amount of oxygen>the amount of silicon>the amount of nitrogen, from the surface side toward the base material side, wherein in the second region, the amount of nitrogen measured by an XPS analysis relative to the total amount, taken as 100 mol %, of the amount of nitrogen, the amount of silicon and the amount of oxygen, has a value in the range of 0.3 mol % to 30 mol %; the amount of silicon has a value in the range of 25 mol % to 50 mol %; and the amount of oxygen has a value in the range of 20 mol % to 70 mol %, and wherein in the second region, the amount of oxygen has a minimum point at which the amount of oxygen decreases and then increases, while the amount of silicon and the amount of nitrogen respectively have a maximum point at which each amount increases and then decreases, from the surface side toward the base material side.

2. The gas barrier film according to claim 1, wherein in the first region, the amount of nitrogen measured by a XPS analysis relative to the total amount, taken as 100 mol %, of the amount of nitrogen, the amount of silicon and the amount of oxygen, has a value in the range of 0.1 mol % to 10 mol %; the amount of silicon has a value in the range of 25 mol % to 49.9 mol %; and the amount of oxygen has a value in the range of 50 mol % to 74 mol %.

3. The gas barrier film according to claim 1, wherein in the third region, the amount of nitrogen measured by an XPS analysis relative to the total amount, taken as 100 mol %, of the amount of nitrogen, the amount of silicon and the amount of oxygen, has a value in the range of 0.1 mol % to 10 mol %; the amount of silicon has a value in the range of 25 mol % to 49.9 mol %; and the amount of oxygen has a value in the range of 50 mol % to 74 mol %.

4. The gas barrier film according to claim 1, wherein in the first region, the amount of oxygen decreases, while the amount of silicon and the amount of nitrogen respectively increase, from the surface side toward the base material side.

5. The gas barrier film according to claim 1, wherein in the third region, the amount of oxygen increases, while the amount of silicon and the amount of nitrogen respectively decrease, from the surface side toward the base material side.

6. The gas barrier film according to claim 1,
wherein a film thickness in the first region has a value in the range of 1 nm to 10 nm,
a film thickness in the second region has a value in the range of 5 nm to 30 nm, and
a film thickness in the third region has a value in the range of 20 nm to 200 nm.

7. The gas barrier film according to claim 1, wherein a water vapor transmission rate is 0.5 g/(m²·day) or less in an atmosphere at 40° C. and 90% RH, and a yellow index, YI, has a value of 0 to 7.

8. The gas barrier film according to claim 1, wherein a refractive index in the first region has a value of below 1.5, a refractive index in the second region has a value of 1.5 or more, and a refractive index in the third region has a value of below 1.5.

9. The gas barrier film according to claim 1, wherein a film density in the first region has a value of below 2.30 g/cm³, a film density in the second region has a value of 2.30 g/cm³ or more, and a film density in the third region has a value of below 2.30 g/cm³.

10. A gas barrier film, comprising a gas barrier layer formed on a base material,
wherein the gas barrier layer contains at least oxygen atoms, silicon atoms and nitrogen atoms, and in connection with an amount of nitrogen, an amount of silicon and an amount of oxygen in the gas barrier layer measured by an XPS analysis, when a surface of the gas barrier layer that is in contact with the base material is designated as a base material side, and the opposite surface is designated as a surface side, the gas barrier layer includes:
a first region in the relationship of the amount of oxygen>the amount of silicon>the amount of nitrogen;
a second region in the relationship of the amount of silicon>the amount of oxygen>the amount of nitrogen;
a third region in the relationship of the amount of oxygen>the amount of silicon>the amount of nitrogen, from the surface side toward the base material side,
wherein in the second region, the amount of nitrogen measured by an XPS analysis relative to the total amount, taken as 100 mol %, of the amount of nitrogen, the amount of silicon and the amount of oxygen, has a value in the range of 0.3 mol % to 30 mol %; the amount of silicon has a value in the range of 25 mol % to 50 mol %; and the amount of oxygen has a value in the range of 20 mol % to 70 mol %,
wherein a refractive index in the first region has a value of below 1.5, a refractive index in the second region has a value of 1.5 or more, and a refractive index in the third region has a value of below 1.5, and
wherein a film thickness in the first region has a value in the range of 1 nm to 10 nm,
a film thickness in the second region has a value in the range of 5 nm to 30 nm, and
a film thickness in the third region has a value in the range of 20 nm to 200 nm.

11. A gas barrier film, comprising a gas barrier layer formed on a base material,
wherein the gas barrier layer contains at least oxygen atoms, silicon atoms and nitrogen atoms, and in connection with an amount of nitrogen, an amount of silicon and an amount of oxygen in the gas barrier layer measured by an XPS analysis, when a surface of the gas barrier layer that is in contact with the base material is designated as a base material side, and the opposite surface is designated as a surface side, the gas barrier layer includes:
a first region in the relationship of the amount of oxygen>the amount of silicon>the amount of nitrogen;
a second region in the relationship of the amount of silicon>the amount of oxygen>the amount of nitrogen;
a third region in the relationship of the amount of oxygen>the amount of silicon>the amount of nitrogen, from the surface side toward the base material side,
wherein in the second region, the amount of nitrogen measured by an XPS analysis relative to the total amount, taken as 100 mol %, of the amount of nitrogen, the amount of silicon and the amount of oxygen, has a value in the range of 0.3 mol % to 30 mol %; the amount of silicon has a value in the range of 25 mol % to 50 mol %; and the amount of oxygen has a value in the range of 20 mol % to 70 mol %, and
wherein a film density in the first region has a value of below 2.30 g/cm³, a film density in the second region has a value of 2.30 g/cm³ or more, and a film density in the third region has a value of below 2.30 g/cm³, and
wherein a film thickness in the first region has a value in the range of 1 nm to 10 nm,
a film thickness in the second region has a value in the range of 5 nm to 30 nm, and
a film thickness in the third region has a value in the range of 20 nm to 200 nm.

* * * * *